United States Patent [19]

Hirabayashi et al.

[11] Patent Number: 5,607,560

[45] Date of Patent: Mar. 4, 1997

[54] DIAMOND CRYSTAL FORMING METHOD

[75] Inventors: Keiji Hirabayashi, Tokyo; Atsushi Yamagami, Kawasaki, both of Japan

[73] Assignee: Canon Kabushiki Kaisha, Tokyo, Japan

[21] Appl. No.: 541,592

[22] Filed: Oct. 10, 1995

Related U.S. Application Data

[63] Continuation of Ser. No. 212,795, Mar. 15, 1994, abandoned.

[30] Foreign Application Priority Data

Mar. 25, 1993 [JP] Japan .................................... 5-066992

[51] Int. Cl.$^6$ ......................... C23C 14/34; C01B 31/06; C30B 29/04
[52] U.S. Cl. ................. 204/192.15; 204/192.16; 204/192.12; 423/446; 117/108; 117/929
[58] Field of Search ........................ 204/192.12, 192.15, 204/192.16, 192.22, 192.25, 192.26, 192.28; 423/446; 117/108, 929

[56] References Cited

U.S. PATENT DOCUMENTS

| | | | |
|---|---|---|---|
| 4,597,844 | 7/1986 | Hiraki et al. | 204/192.15 |
| 4,767,517 | 8/1988 | Hiraki et al. | 204/192.15 |
| 4,824,546 | 4/1989 | Ohmi | 204/298.08 |
| 5,073,241 | 12/1991 | Watanabe | 204/192.15 |

FOREIGN PATENT DOCUMENTS

| | | | |
|---|---|---|---|
| 1-298097 | 12/1989 | Japan | 204/192.12 |
| 3-279294 | 12/1991 | Japan | 204/192.12 |
| 532489 | 2/1993 | Japan . | |

*Primary Examiner*—R. Bruce Breneman
*Assistant Examiner*—Rodney G. McDonald
*Attorney, Agent, or Firm*—Fitzpatrick, Cella, Harper & Scinto

[57] ABSTRACT

A diamond crystal forming method with which a diamond crystal is formed on a substrate by a sputtering process uses high-frequency energy in the frequency range of 40 MHz to 250 MHz to form plasma.

7 Claims, 2 Drawing Sheets

DIAMOND CRYSTAL FORMING METHOD

This application is a continuation of application Ser. No. 08/212,795, filed Mar. 15, 1994, now abandoned.

BACKGROUND OF THE INVENTION

1. Field of the Invention

The present invention relates to a method of forming a diamond crystal which has superior characteristics as electronic materials.

2. Description of the Related Art

Diamonds have various superior characteristics which cannot be obtained by other materials, e.g., a large band gap (5.5 eV), large carrier mobility (electron; 1800 $cm^2/V \cdot S$, hole; 1600 $cm^2/V \cdot S$), large thermal conductivity [200 $W/(m \cdot K)$], high hardness, and high wear resistance.

Therefore, methods of synthesizing diamonds from the vapor phase, particularly, a chemical vapor deposition process, have been studied recently. Primary methods of forming diamonds are as follows.

1) A thermal filament CVD process in is which material gas decomposed by heating a filament made of, e.g., tungsten to about 2000° C. so that a diamond crystal is deposited on a substrate.
2) A microwave plasma CVD process in which material gas is decomposed by microwave plasma (usually at 2.45 GHz) so that a diamond crystal is deposited on a substrate.
3) An RF plasma CVD process in which material gas is decomposed by RF Plasma (usually at 13.56 MHz) so that a diamond crystal is deposited on a substrate.
4) A burning flame process in which a diamond crystal is formed by using an oxygen—acetylene flame,
5) An ECR plasma CVD process in which material gas is decomposed by forming ECR (Electron Cyclotron Resonance) discharge in combination with a microwave and a magnetic field so that a diamond crystal is formed on a substrate.
6) A thermal plasma CVD process in which material gas is decomposed by DC or high-frequency thermal plasma under a Pressure near the atmospheric Pressure so that a diamond crystal is formed.
7) Of late, Japanese Patent Laid-Open No. 5-32489 proposes a plasma CVD process using plasma in the ultrashort wave range of 30 to 300 MHz.

However, the prior art methods of forming a diamond crystal described above have problems as discussed below.

The thermal filament CVD process of 1) is advantageous in that a diamond crystal can be formed in a large area and at a relatively high forming rate, but is disadvantageous in that the filament is carbonized or deteriorates over time and reproducibility in forming diamonds is low.

The microwave plasma CVD process of 2) is advantageous in that the plasma density is high, the forming rate of a diamond crystal is relatively high, and the reproducibility is good, but is disadvantageous in that plasma tends to localize, making it difficult to form a diamond crystal in a large area.

The RF plasma CVD process of 3) is advantageous in that a diamond crystal can be formed in a large area and the reproducibility is good, but is disadvantageous in that the plasma density is low and the forming rate of a diamond crystal is low.

The burning flame process of 4) is advantageous in that the forming rate of a diamond crystal is very high, but is disadvantageous in that the reproducibility is low and a diamond crystal is difficult to develop in a large area.

The ECR plasma CVD process of 5) is advantageous in that a diamond crystal can be formed in a large area and the reproducibility is good, but is disadvantageous in that the forming rate of a diamond crystal is slow because the pressure is required to be kept low (generally less than 100 Pa) in order to create the ECR discharge.

The thermal plasma CVD process of 6) is advantageous in that the forming rate of a diamond crystal is very high and the reproducibility is good, but is disadvantageous in that it is difficult to form a diamond crystal in a large area.

The plasma CVD process in the ultrashort wave range (30 to 300 MHz) of 7) is superior to any of the above-described processes, but a diamond crystal cannot be always stably formed on a substrate of a large area due to unevenness of the plasma. Also, because a diamond crystal under formation is subjected to impacts of ions having energy of several tens eV from the plasma, such ion impacts may reduce the forming rate of a diamond crystal and deteriorate crystallinity. Thus, a further improvement in the crystal growing rate and crystallinity is demanded.

SUMMARY OF THE INVENTION

In view of the above-described problems in the prior art, an object of the present invention is to provide a diamond crystal forming method which can form a diamond crystal in a large area with good reproducibility and at a high forming rate.

Another object of the present invention is to provide a diamond crystal forming method with which a diamond crystal is formed on a substrate by a sputtering process using high-frequency energy in the frequency range of 40 MHz to 250 MHz to form plasma.

DESCRIPTION OF THE INVENTION AND PREFERRED EMBODIMENTS

The diamond crystal forming method of the present invention is featured in that a diamond crystal is formed on a substrate by a sputtering process using high-frequency energy in the frequency range of 40 MHz to 250 MHz to form plasma.

According to the method of the present invention, a diamond crystal film with superior evenness of film thickness and having high quality can be formed in a large area at a high forming rate and with high stability. The method of the present invention can also form a flat-plate diamond crystal suitable for use as electronic materials.

As discussed above, the microwave discharge (usually at 2.45 GHz) has a high plasma density, but tends to localize the plasma, resulting in difficulties in forming a diamond crystal in a large area; The RF discharge (usually at 13.56 MHz) can easily spread the plasma and hence form a diamond crystal in a large area, but the plasma density is low. With a view of overcoming those disadvantages of the above prior art processes, the inventors have studied forming a diamond crystal by a sputtering process, and in particular, using plasma discharge in a frequency range intermediate the ranges used with both prior art sputtering processes, typically from 40 MHz to 250 MHz, preferably from 80 MHz to 200 MHz, and have found that plasma is produced over a wide region with a high plasma density, and a diamond crystal is formed in a large area at a high forming rate.

The frequency range including the range one of 40 MHz to 250 MHz is generally called VHF (very high frequency) range.

Figure 1:
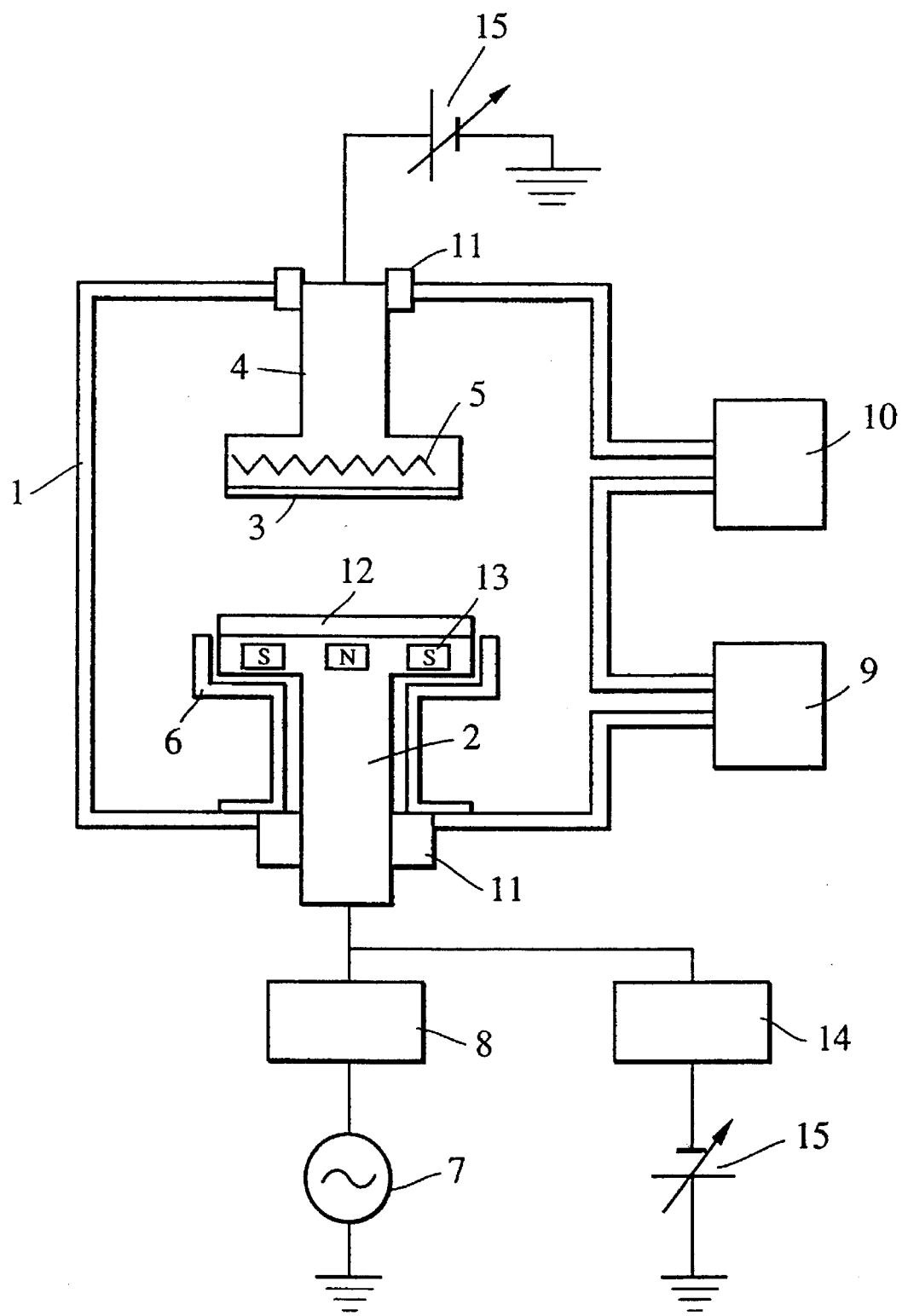
FIG. 1 is a schematic view showing one example of a sputtering apparatus used for embodying a diamond crystal forming method of the present invention.

FIG. 1 shows one example of a sputtering apparatus used for embodying the present invention. The sputtering apparatus comprises a reaction vessel 1 of pressure reducible type in which a high-frequency electrode 2 electrically isolated from the reaction vessel 1 by an insulating material 11 and a substrate 3 as an opposite electrode are disposed. A graphite target 12 is fixed to the high-frequency electrode 2. Magnets 13 are disposed inside the high-frequency electrode 2. The substrate 3 is held by a substrate support 4 such that it is heated from its inner side by a heater 5 built in the support 4 and a bias voltage is applied to the substrate from a DC power supply 15. A grounding shield 6 is disposed around the high-frequency electrode 2 so as to prevent discharge from occurring between the high-frequency electrode 2 and the reaction vessel 1. A VHF power supply 7 is connected to the high-frequency electrode 2 through a matching circuit 8. A DC power supply 15 is connected to the high-frequency electrode 2 through a low-pass filter 14 so that a DC bias voltage is applied to the target 12 for thereby increasing a sputtering rate. Additionally, 9 and 10 denote a vacuum evacuating means and a gas supply means, respectively.

Examples of a sputtering target used in the present method include graphite, vitreous carbon and diamond, but graphite is generally used. As sputtering gas, one or a mixture of two or more of rare gases such as argon, neon or helium, and gas containing hydrogen, oxygen, chlorine or fluorine can be used. Generally used is a gas mixture comprising rare gas, as main material gas, and hydrogen at a ratio in the range of 1:0.01 to 1:100. In cases of forming semiconductor diamonds, it is possible to add gas, which contains boron for p-type semiconductors and phosphorus, lithium, sodium or the like for n-type semiconductors, into the sputtering gas, or to mix any of those elements in the target.

It is desirable in the present method that the substrate temperature be kept in the range of 300° C. to 1400° C., preferably 500° C. to 1000° C.

Also, it is desirable in the present method that the pressure inside the reaction vessel during forming of a diamond crystal film is kept in the range of 1Pa to $1^4$ Pa, preferably 10 Pa to $5\times10^3$ Pa, more preferably $5\times10$ Pa to $10^3$ Pa.

While crystallinity of a diamond crystal can be evaluated by various methods such as utilizing X-ray diffraction, electron beam diffraction, electron beam energy loss spectrum, and cathode luminescence, Raman spectrometry is effective in detecting amorphous carbon and graphite carbon. With Raman spectrometry, the peak of a diamond crystal is observed near 1333 $cm^{-1}$, and amorphous carbon or graphite carbon has broad peaks near 1350 $cm^{-1}$ and 1580 $cm^{-1}$.

The diamond crystal formed by the present method has good crystallinity so that a ratio ($I_{1580}/I_{1333}$) of the peak (1580 $cm^{-1}$) of the amorphous carbon or graphite carbon to the peak (1333 $cm^{-1}$) of the diamond crystal is not larger than 1, preferably 0.5.

In addition, a flat-plate diamond crystal having the shape of a flat plate can also be formed by the present method.

Figure 2:
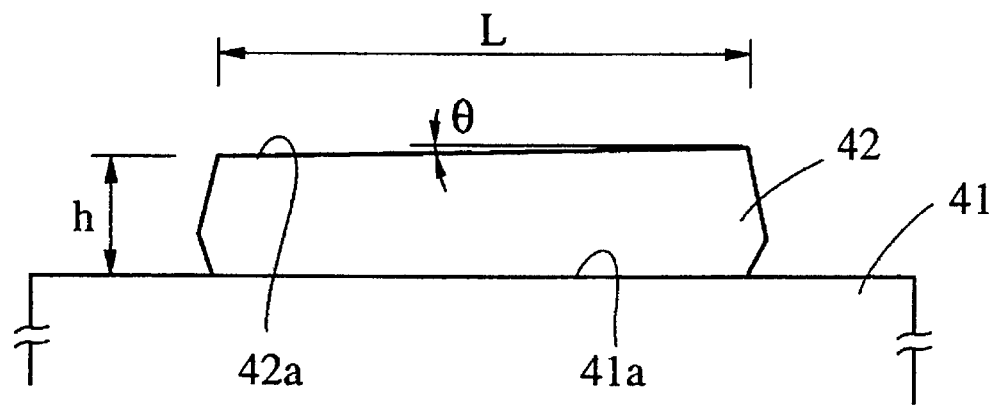
FIG. 2 is a schematic view of a flat-plate diamond crystal obtainable with the present invention.
Figure 3:
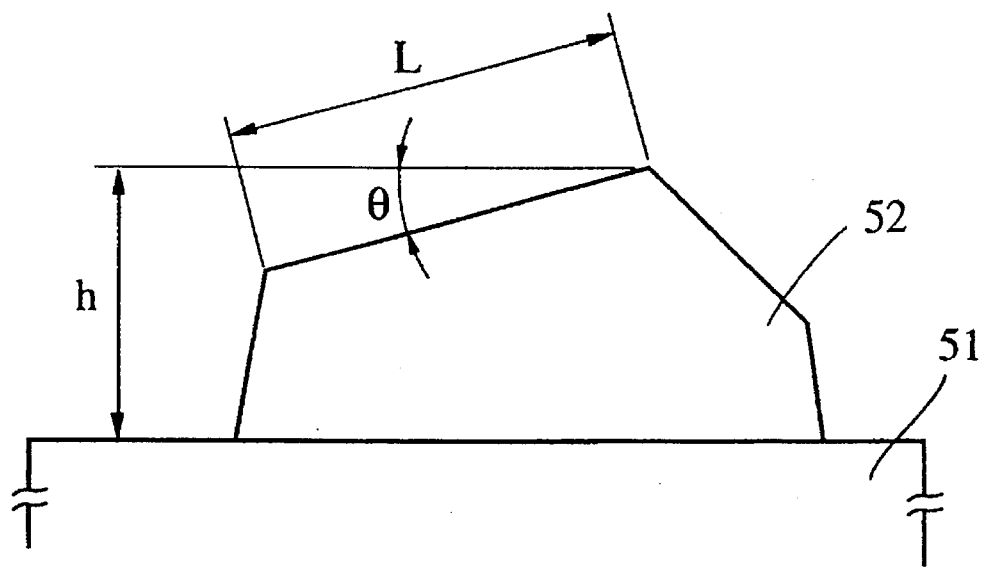
FIG. 3 is a schematic view of a granular diamond crystal.

A cross-section of a flat-plate diamond crystal which can be formed by the present method is schematically shown in FIG. 2, and a granular diamond crystal is schematically shown in FIG. 3.

Referring to FIG. 2, denoted by 41 is a substrate on an upper surface of which a flat-plate diamond crystal 42 of the present invention is formed. A ratio (h/L) of the length (height) h of the flat-plate diamond crystal 42 in a direction vertical to the substrate surface to the length (horizontal width) L in a direction parallel to the substrate surface is not larger than ¼, typically ¼.5, preferably in the range of ⅕ to ¹⁄₁₀₀₀. Further, an upper surface 42a of the crystal is of the {111} plane, and an angle θ formed between the crystal surface 42a and the substrate surface 41a is in the range of 0 to 10 degrees, meaning the crystal surface is substantially parallel to the substrate surface.

The diamond crystal having such a form will be hereinafter referred to as a flat-plate diamond crystal.

On the other hand, a granular diamond crystal 52 shown in FIG. 3 has a ratio (h/L) of the height h to the horizontal width L not less than 1⅓, typically ½. Incidentally, 51 denotes a substrate.

The diamond crystal having such a form will be hereinafter referred to as a granular diamond crystal. In this type of diamond crystal, an angle θ formed between an upper surface of the crystal grain and the substrate surface is generally random.

The flat-plate diamond crystal obtainable with the present method can be formed only under conditions adapted for forming a crystal with extremely high quality. By way of example, the flat-plate diamond crystal can be formed under conditions described below.

It is essential that the sputtering gas contains at least hydrogen and oxygen. Rare gas is added to the sputtering gas, if necessary. A ratio (O/H) of oxygen to hydrogen is in the range of 0.005 to 1, preferably 0.01 to 0.1. If the ratio is less than 0.005, the effect of adding oxygen would not be appreciable. If the ratio is larger than 1, the etching effect of oxygen upon the diamond crystal would be too large to provide a practical growing rate of the diamond crystal.

By keeping the substrate temperature in the range of 400° C. to 900° C., preferably 500° C. to 750° C., more preferably 600° C. to 700° C., the flat-plate diamond crystal of which upper surface is of the {111} plane and a triangular or hexagonal morphology can be formed.

The flat-plate diamond crystal formed by the present method is a single crystal or a twin crystal having a twinning plane in the flat plate. Then, in many cases, the twinning plane is formed parallel to the upper surface of the flat-plate diamond crystal. This is achievable because a reentrant angle is produced with the formation of the twinning plane. In other words, a crystal tends to accelerate its growth in the direction of a reentrant angle under the action of a so-called reentrant angle effect, and the formation of the flat-plate diamond crystal is forced to progress in that direction. Additionally, the number of twinning planes formed parallel to the crystal upper surface is not always only one, but may be two or more in some cases.

Furthermore, a diamond crystal film can be formed by causing a number of flat-plate diamond crystals to grow together into the form of a film. Since this diamond crystal film is produced such that a number of flat-plate diamond crystals of which grains are relatively even in height are accelerated to grow together in the horizontal direction, unevenness of the film surface is so small that a film having a high degree of smoothness with maximum surface roughness of 100 nm, for example, can be obtained.

The present invention will be described below in more detail in conjunction with Examples.

EXAMPLES 1 to 4 AND COMPARATIVE EXAMPLES 1 to 3

In these Examples and Comparative Examples, the sputtering apparatus shown in FIG. 1 was employed and diamond crystals were formed by producing plasmas at various frequencies.

Forming conditions were as follows: target; graphite, material gas; hydrogen 200 ml/min and argon 200 ml/min, pressure; $2 \times 10_2$ Pa, VHF output; 500 W, and target bias; −150 V. A silicon single-crystal substrate (3 inches in diameter, 400 μm thick) was used as the substrate 3 and heated to 700° C. by the heater 5. The forming time was set to 5 hours. Results are shown in Table 1 below.

Also, in each of the Examples and the Comparative Examples, the plasma potential was measured separately before starting to form a diamond crystal. Afterward, during the formation of a diamond crystal, a substrate bias with the same value as the measured plasma potential was applied to the substrate ($V_{P-S}$=0 V).

Measurement of the plasma potential was carried out as follows. Before start oil forming a diamond crystal, a frequency characteristic of plasma density was measured by the well-known two-probe method. Plasmas were produced at various frequencies and the plasma density was measured for each frequency. Further, dependency of plasma potential upon frequency was measured by using an ion energy analyzer on the same conditions as for the measurement of the plasma density. The ion energy analyzer was installed in the vicinity of the substrate, and the potential value at which an amount of impinging ions was maximized was detected as a plasma potential.

Then, after removing the probes for measuring the plasma density and the ion energy analyzer, diamond crystals were formed by producing plasmas at various frequencies.

TABLE 1

|  | Frequency | Film thickness | Plasma stability |
|---|---|---|---|
| Example 1 | 42 MHz | 3 μm | ⊚ |
| Example 2 | 100 MHz | 12 μm | ⊚ |
| Example 3 | 200 MHz | 15 μm | o |
| Example 4 | 250 MHz | 8 μm | Δ |
| Com. Ex. 1 | 13.56 MHz | below 1 μm | ⊚ |
| Com. Ex. 2 | 27 MHz | below 1 μm | ⊚ |
| Com. Ex. 3 | 280 MHz | diamond not formed due to instable discharge | X |

⊚: very good
o: good
Δ: practically feasible
X: incapable of forming stable plasma As seen from Table 1, in Examples 1 to 4, diamond crystals could be stably formed at a high forming rate. Also, evenness of the film thickness was good.

In Comparative Examples 1 and 2, the growing rate of diamond crystals was small. In Comparative Example 3, the discharge could not be stabilized and it was difficult to form a diamond crystal.

EXAMPLES 5 to 8 AND COMPARATIVE EXAMPLES 4 to 6

In these Examples and Comparative Examples, diamond crystals were formed by a sputtering process with the substrate bias varied. Forming conditions were as follows: frequency of VHF waves; 100 MHz, sputtering gas; hydrogen 200 ml/min, argon 200 ml/min and oxygen 2 ml/min, pressure; 200 Pa, and VHF output; 800 W. The forming time was set to 6 hours. As a result of separately measuring a plasma potential on the same conditions before starting to form a diamond crystal, the plasma potential was found to be 30 V.

Crystallinity of the formed diamond crystals was evaluated by utilizing X-ray diffraction and Raman spectrometry. Results are shown in Table 2 below.

TABLE 2

|  | Substrate bias | $V_{P-S}$ | Film thickness | Crystallinity |
|---|---|---|---|---|
| Example 5 | 20 V | 10 V | 4 μm | o |
| Example 6 | 30 V | 0 V | 10 μm | ⊚ |
| Example 7 | 40 V | −10 V | 12 μm | ⊚ |
| Example 8 | 50 V | −20 V | 8 μm | o |
| Com. Ex. 4 | 0 V | 30 V | below 1 μm | X |
| Com. Ex. 5 | 17 V | 13 V | 2 μm | X |
| Com. Ex. 6 | 55 V | −25 V | 4 μm | X |

⊚: very good crystallinity
o: good crystallinity
X: poor crystallinity

In Examples 5 to 8, diamond crystals were formed at a high forming rate and with good crystallinity. Also, evenness of the film thickness was good. In Comparative Examples 4 and 5, the growing rate of diamond crystals was small, an amorphous layer mixed in the film was observed, and crystallinity was poor. In Comparative Example 6, the substrate temperature exceeded the set value, and a graphite crystal mixed in the diamond crystal was observed. From Table 2, it is understood that the difference of plasma potential—substrate bias potential (i.e., $V_{P-S}$) is preferably kept in the range of −20 V to 10 V.

EXAMPLE 9

Forming conditions were as follows: frequency of VHF waves; 100 MHz, material gas; hydrogen 200 ml/min and argon 100 ml/min, pressure; $2 \times 10^3$ Pa, VHF output; 800 W, and forming time; 5 hours. As a result of separately measuring a plasma potential on the same conditions before starting to form diamond crystal, the plasma potential was found to be 6 V. A diamond crystal was then formed by grounding the substrate (i.e., $V_{P-S}$=6V).

In this Example, a diamond crystal was formed with a film thickness of about 10 μm and good crystallinity. Also, evenness of the film thickness was good.

EXAMPLE 10

Forming conditions were as follows: frequency of VHF waves; 100 MHz, material gas; hydrogen 100 ml/min, argon 200 ml/min and oxygen 2 ml/min, pressure; $2 \times 10^3$ Pa, VHF output; 600 W, and target bias; −200 v. A silicon single-crystal substrate (3 inches in diameter, 400 μm thick) was used as the substrate 3 and heated to 650° C. by the heater 5. The forming time was set to 6 hours. As a result of separately measuring a plasma potential on the same conditions before starting to form a diamond crystal, the plasma potential was found to be 6 V. A diamond crystal was then formed by applying a substrate bias of 10 V (i.e., $V_{P-S}$=−4 V).

In this Example, a flat-plate diamond crystal was formed in which the hexagonal {111} plane was oriented parallel to the substrate surface, the value of height/horizontal width was not larger than ⅕, and the mean grain size was about 20 μm.

Further, diamond was formed on the same conditions as those described above except that the forming time was set to 12 hours. As a result, the flat-plate diamond crystal was grown together into, a column shape and a diamond polycrystalline film having good evenness was formed.

According to the method of the present invention, as described hereinabove, a high-quality diamond crystal can be stably formed. Particularly, a flat-plate diamond crystal and a diamond crystal thin film having high evenness in its film thickness can be formed in a large area with high stability (reproducibility) and at a high forming rate.

What is claimed is:

1. A diamond crystal forming method comprising the steps of:

positioning a substrate and a target in a reaction vessel;

supplying a sputtering gas to the reaction vessel; and forming a diamond crystal on the substrate by applying high-frequency energy in the frequency range of 40 MHz to 250 MHz to the target for performing a plasma discharge while applying a DC bias voltage to the substrate, wherein the DC bias voltage satisfies the following formula:

$-20 \text{ V} \leq$ plasma potential−bias voltage applied to the substrate $\leq 10$ V.

2. A diamond crystal forming method according to claim 1, further comprising the step of keeping a temperature of the substrate in the range of 300° C. to 1400° C.

3. A diamond crystal forming method according to claim 1, further comprising the step of forming the diamond crystal while a pressure inside the reaction vessel is controlled to be kept in the range of 1 Pa to $10^4$ Pa.

4. A diamond crystal forming method according to claim 1, further comprising the step of using a sputtering gas that contains at least hydrogen and oxygen.

5. A diamond crystal forming method according to claim 4, further comprising the step of setting a ratio of oxygen atoms to hydrogen atoms to a range of 0.005 to 1 and keeping a temperature of the substrate in the range of 400° C. to 900° C. so that a crystal is formed as a flat-plate diamond with ratio of height to horizontal width being not larger than ¼.

6. A diamond crystal forming method according to claim 1, further comprising the step of forming a granular diamond crystal with a ratio of height to horizontal width not less than ⅓.

7. A diamond crystal forming method according to claim 1, wherein the step of plasma discharge is in the frequency range of 80 MHz to 200 MHz.

* * * * *

UNITED STATES PATENT AND TRADEMARK OFFICE
CERTIFICATE OF CORRECTION

PATENT NO. : 5,607,560

DATED : March 4, 1997

INVENTOR(S) : Hirabayashi et al.

It is certified that error appears in the above-identified patent and that said Letters Patent is hereby corrected as shown below:

COLUMN 1:

Line 22, "is" should be deleted, and "gas" should read --gas is--.

COLUMN 3:

Line 7, "one" should be deleted.
  Line 49, "$1^4$ Pa," should read --$10^4$ Pa,--.

COLUMN 4:

Line 41, "750°C," should read --750°C, and--.

COLUMN 5:

Line 12, "$2 \times 10_2$ Pa," should read --$2 \times 10^2$ Pa,--.
  Line 24, "oil" should read --of--.

UNITED STATES PATENT AND TRADEMARK OFFICE
CERTIFICATE OF CORRECTION

PATENT NO. : 5,607,560
DATED : March 4, 1997
INVENTOR(S) : Hirabayashi et al.

It is certified that error appears in the above-indentified patent and that said Letters Patent is hereby corrected as shown below:

<u>COLUMN 6</u>:

Line 59, "200 v." should read -- -200V.--.

Signed and Sealed this

Second Day of December, 1997

Attest:

BRUCE LEHMAN

Attesting Officer

Commissioner of Patents and Trademarks